United States Patent
Koranne

(10) Patent No.: US 10,372,870 B2
(45) Date of Patent: Aug. 6, 2019

(54) HOMOTOPY OPTIMIZED PARASITIC EXTRACTION

(71) Applicant: Mentor Graphics Corporation, Wilsonville, OR (US)

(72) Inventor: Sandeep Koranne, West Linn, OR (US)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

(21) Appl. No.: 15/201,279

(22) Filed: Jul. 1, 2016

(65) Prior Publication Data

US 2018/0004887 A1    Jan. 4, 2018

(51) Int. Cl.
*G06F 17/50* (2006.01)

(52) U.S. Cl.
CPC ...... *G06F 17/5081* (2013.01); *G06F 17/5068* (2013.01); *Y02E 60/76* (2013.01); *Y04S 40/22* (2013.01)

(58) Field of Classification Search
USPC ........................................ 716/111, 115, 132
See application file for complete search history.

(56) References Cited

U.S. PATENT DOCUMENTS

| | | | |
|---|---|---|---|
| 6,289,412 B1* | 9/2001 | Yuan | G06F 17/5022 703/14 |
| 6,421,814 B1* | 7/2002 | Ho | G06F 17/5081 716/113 |
| 8,677,300 B2 | 3/2014 | Koranne et al. | |
| 2010/0180241 A1* | 7/2010 | Asai | G06F 17/5036 716/107 |
| 2012/0185807 A1* | 7/2012 | Tsai | G06F 17/5081 716/52 |
| 2013/0086542 A1* | 4/2013 | Teoh | G06F 17/5031 716/113 |
| 2015/0186591 A1* | 7/2015 | Gurney | G06F 17/5081 716/116 |

* cited by examiner

*Primary Examiner* — Brian Ngo

(57) ABSTRACT

Aspects of the disclosed technology relate to techniques of parasitic extraction. A signature for a set of geometric elements of a layout design is computed based on contour-related information. The set of geometric elements corresponds to a net of connected equipotential interconnects of a circuit design. Based on comparing the signature with signatures for sets of geometric elements that have computed parasitic element values, parasitic element values for the set of geometric elements are determined.

20 Claims, 6 Drawing Sheets

Flow chart
400

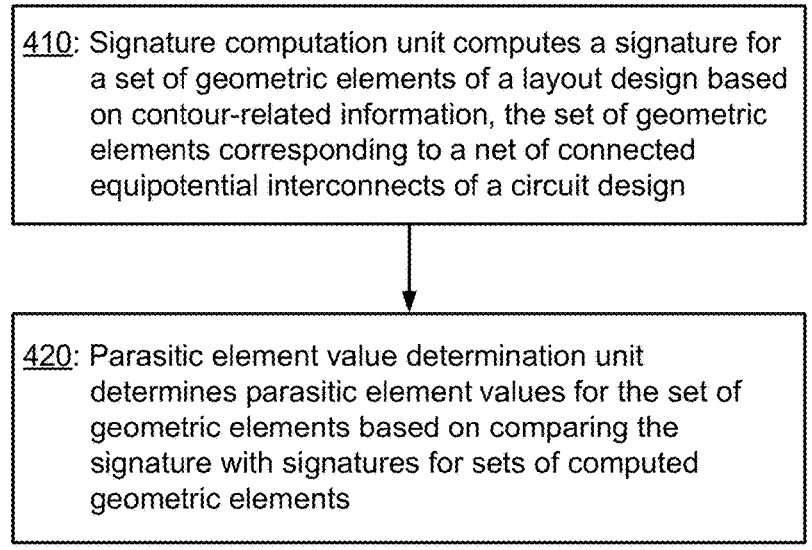
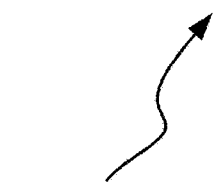
Flow chart
400
FIG. 4

HOMOTOPY OPTIMIZED PARASITIC EXTRACTION

FIELD OF THE DISCLOSED TECHNOLOGY

The present disclosed technology relates to integrated circuit design and fabrication technologies. Various implementations of the disclosed technology may be particularly useful for parasitic extraction.

BACKGROUND OF THE DISCLOSED TECHNOLOGY

The extraction of parasitic circuit models is important for various aspects of physical verification such as timing, signal noise, and power grid analysis. Even though the recent processing technology advancements of copper interconnect reduces the effect of parasitic resistance and the low k (<3) dielectric material reduces the effect of parasitic capacitance, the continued scaling down of the feature size keeps the parasitic effects dominant, and makes it a necessity to account accurately for parasitic effects for large and complicated interconnect structures.

Parasitic extraction requires solving some form of Maxwell's equations with layout design and process profile data. Analytical formulas for simple or simplified geometry may be used where accuracy is less important than speed. However, numerical solution of the appropriate form of Maxwell's equation must be employed when the geometric configuration is not simple and accuracy demands do not allow simplification. The processor time and memory for numerically solving a differential form of or an integral form of the governing equations increase rapidly with the number of elements in the discretization of electromagnetic field. Fortunately, modern semiconductor designs are highly repetitive, either due to hierarchy or the use of programmatic layout generators. Parasitic elements extracted from such repetitive structures may demonstrate auto-correlation. It is thus advantageous to develop a method to optimize the parasitic extraction process based on the layout homotopy.

BRIEF SUMMARY OF THE DISCLOSED TECHNOLOGY

Aspects of the disclosed technology relate to techniques of parasitic extraction. In one aspect, there is a method comprising: computing a signature for a set of geometric elements of a layout design based on contour-related information, the set of geometric elements corresponding to a net of connected equipotential interconnects of a circuit design; and determining parasitic element values for the set of geometric elements based on comparing the signature with signatures for sets of computed geometric elements, the sets of computed geometric elements having computed parasitic element values.

The signature may be computed based on signatures for geometric elements on individual physical layers and on signatures for interconnects between the physical layers. The signatures for geometric elements on individual physical layers may be derived using a mathematical function. The contour-related information may be generated based on a rasterizing scanline analysis of the geometrical elements on individual physical layers.

The determining may comprise associated some of the computed parasitic element values with the net of connected equipotential interconnects if the signature matches one of the signatures; and computing parasitic element values for the net of connected equipotential interconnects and adding the signature to the signatures if the signature matches none of the signatures.

The determining may comprise associated some of the computed parasitic element values with the net of connected equipotential interconnects if the signature matches one of the signatures, a signature for a second net of connected equipotential interconnects matches one of the signatures, and location information of the net of connected equipotential interconnects relative to the second net of connected equipotential interconnects matches one for corresponding two sets of computed geometric elements; and computing parasitic element values for the net of connected equipotential interconnects and adding the signature to the signatures if the signature matches none of the signatures, the signature for the second net of connected equipotential interconnects does not match one of the signatures, or location information of the net of connected equipotential interconnects relative to the second net of connected equipotential interconnects does not match one for corresponding two sets of computed geometric elements.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 4 illustrates a flowchart showing a process of parasitic extraction that may be implemented according to various examples of the disclosed technology.

DETAILED DESCRIPTION OF THE DISCLOSED TECHNOLOGY

Figure 1:
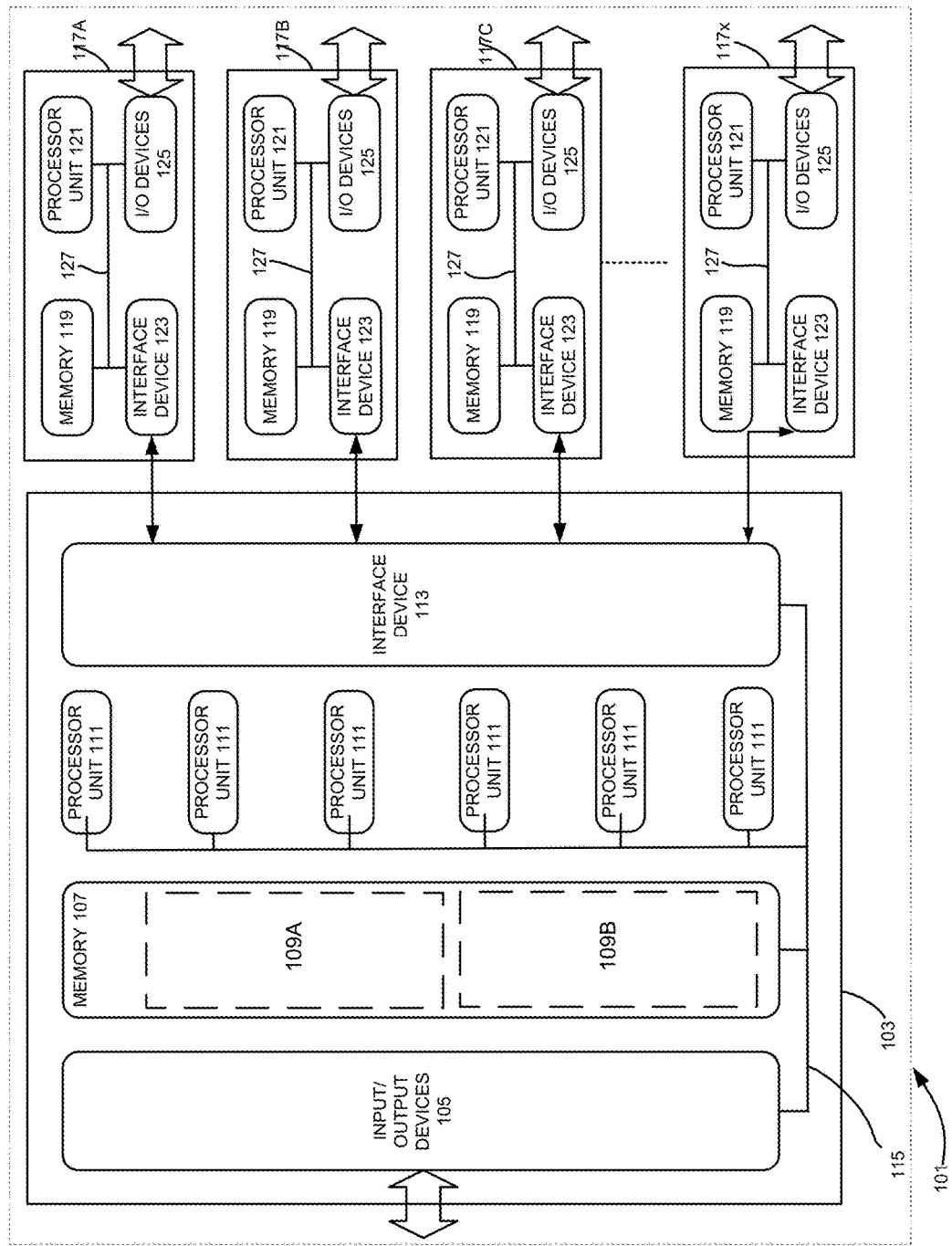
FIG. 1 illustrates an example of a computing system that may be used to implement various embodiments of the disclosed technology.

Various aspects of the present disclosed technology relate to techniques of parasitic extraction. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "compute" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations.

The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
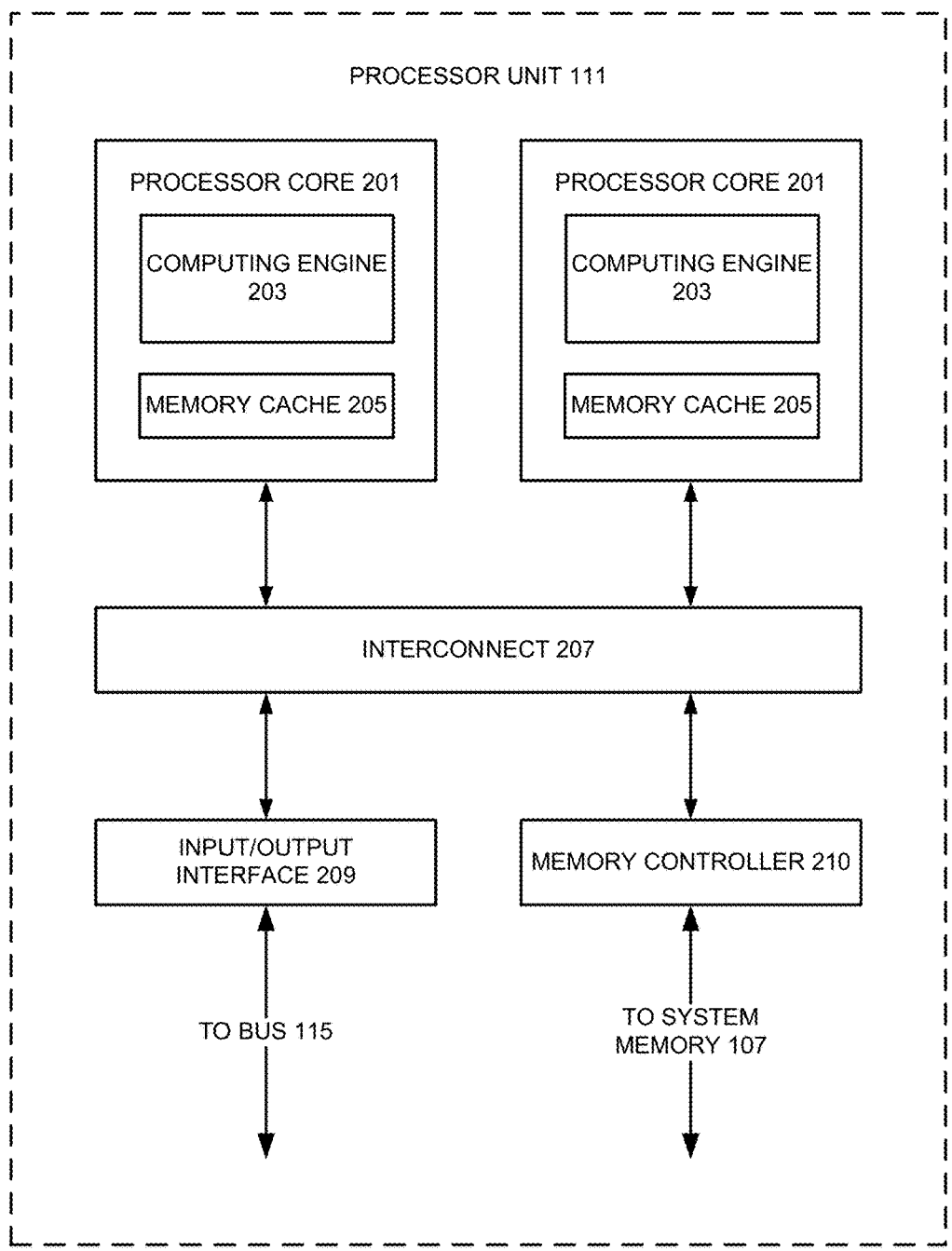
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Layout Design

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

IC layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Parasitic Extraction Tool

Figure 3:
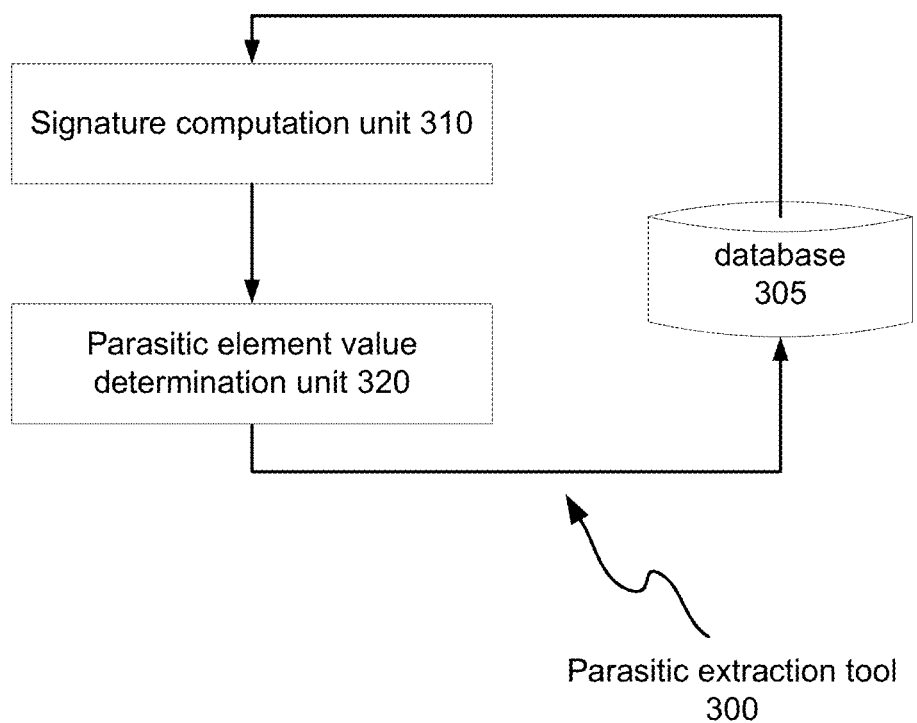
FIG. 3 illustrates an example of a parasitic extraction tool that may be implemented according to various embodiments of the disclosed technology.

FIG. 3 illustrates an example of a parasitic extraction tool 300 that may be implemented according to various embodiments of the disclosed technology. As seen in this figure, the parasitic extraction tool 300 includes a signature computation unit 310 and a parasitic element value determination unit 320. Some implementations of the parasitic extraction tool 300 may cooperate with (or incorporate) a database 305.

As will be discussed in more detail below, the signature computation unit 310 computes a signature for a set of geometric elements of a layout design based on contour-related information. The set of geometric elements corresponds to a net of connected equipotential interconnects of a circuit design. The parasitic element value determination unit 320 then determines parasitic element values for the set of geometric elements based on comparing the signature with signatures for sets of computed geometric elements. The sets of computed geometric elements have computed parasitic element values. The layout design, the signatures and the computed parasitic element values may be stored in the database 305.

As previously noted, various examples of the disclosed technology may be implemented by one or more computing systems, such as the computing system illustrated in FIGS. 1 and 2. Accordingly, one or both of the signature computation unit 310 and the parasitic element value determination unit 320 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or both of the signature computation unit 310 and the parasitic element value determination unit 320. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It should also be appreciated that, while the signature computation unit 310 and the parasitic element value determination unit 320 are shown as separate units in FIG. 3, a single computer (or a single processor within a master computer) or a single computer system may be used to implement all of these units at different times, or components of these units at different times.

With various examples of the disclosed technology, the database 305 may be implemented using any suitable computer readable storage device. That is, the database 305 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information.

Parasitic Extraction

FIG. 4 illustrates a flowchart 400 showing a process of parasitic extraction that may be implemented according to various examples of the disclosed technology. For ease of understanding, methods of parasitic extraction that may be employed according to various embodiments of the disclosed technology will be described with reference to the parasitic extraction tool 300 in FIG. 3 and the flow chart 400 illustrated in FIG. 4. It should be appreciated, however, that alternate implementations of a parasitic extraction tool may be used to perform the methods of parasitic extraction illustrated by the flow chart 400 according to various embodiments of the disclosed technology. Likewise, the parasitic extraction tool 300 may be employed to perform other methods of parasitic extraction according to various embodiments of the disclosed technology.

In operation 410, the signature computation unit 310 computes a signature for a set of geometric elements of a layout design based on contour-related information. The set of geometric elements corresponds to a net of connected equipotential interconnects of a circuit design. The net of connected equipotential interconnects may comprise interconnect segments on various physical layers. These interconnect segments may be connected using vias. The signature may be computed based on signatures for geometric elements on individual physical layers and on canonical signatures for interconnects between the physical layers. The signatures for geometric elements on individual physical layers may be derived using a mathematical function.

With various examples of the disclosed technology, the contour-related information for geometric elements in layout design data may be obtained using a scan line technique. This technique sequentially processes geometric edge information occurring along a line in the layout design data along a single direction, such as from left to right, top to bottom, etc. In various examples of the disclosed technology, the scan line captures data at every edge end point and every intersection of edges. These data capture points are referred to as scan stops. Typically, each scan stop will occur at the intersection of two or more edges for bounded geometric elements. While some implementations of the disclosed technology may employ a scan line that sequentially moves through each portion of the design data, still other implementations of the disclosed technology may use a "discrete" scan line that jumps directly from scan stop to scan stop.

With this arrangement, the scan line analysis captures state data at each scan stop that can be used to uniquely determine the contours of the geometric elements in the input layout data. For example, according to some implementations of the disclosed technology, the state data obtained by the scan line analysis comprises the number of geometric element edges intersecting the scan line, their relative order on the scan line, and the order of their insertion and deletion. Thus, given an input edge segment between Cartesian coordinate values (x1, y1) and (x2, y2) that is inserted into the scan line when the scan line is along the coordinate value x1, the state of the edge segment may be denoted by a tuple #S(n, m, p, o). In this tuple, n denotes the number of segments that have already been inserted into the scan line, m denotes the number of segments currently active in the scan line (i.e., currently intersecting the scan line), p denotes the intersection vector of m with the scan line, and o denotes the set of endpoints for the edge segments.

Figure 5:
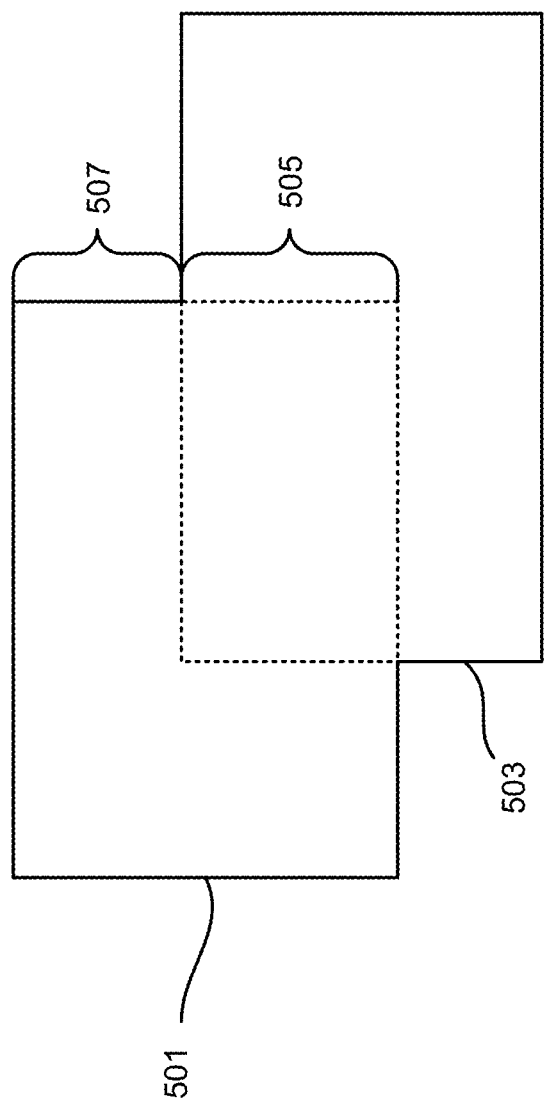
FIG. 5 shows a line segment inside of an outer contour of a plurality of overlapping geometric elements, and a line segment along an outer contour of the plurality of overlapping geometric elements.

As previously noted, the tuple value p is the intersection vector of m with the scan line (which may be referred to as a "lap count"). This value, which may be stored in a record of size m, indicates when a scan stop is inside of the contour of a geometric element or plurality of abutting or overlapping geometric elements. That is, because this value is based upon the direction of a bounded shape relative to its intersecting edge, (e.g., the bounded shape extends "upward" from the edge or "downward" from the edge, based upon the intersection of the endpoint of the edge with another edge of the bounding shape), it will indicate whether an edge segment is inside of the contour formed by a geometric element or plurality of abutting or overlapping geometric elements, or if the edge segment is a part of the contour formed by a geometric element or plurality of abutting or overlapping geometric elements. For example, FIG. 5 shows a plurality of overlapping geometric elements 501, 503. In this figure, edge segment 505 (shown with a dotted line) occurs inside of the contour of the overlapping geometric elements 501, 503 (shown with a solid line), while edge segment 507 occurs along the contour of the overlapping geometric elements 501, 503.

The value of m then can be used to keep track of when a value of p for an edge must be updated at a scan stop. For example, when the scan line moves from left to right, the value of p for an edge below a new edge inserted into the scan line does not need to be updated, while the values of p for an edge below a new edge inserted into the scan line does. The value of o then denotes the set of endpoints of the edge segments. With various embodiments of the disclosed technology, before contour edge segment (i.e., an edge segment that is a part of the contour formed by a geometric element or plurality of abutting or overlapping geometric elements) is discarded from the scan line, characteristics of that edge segment, such as the value of o (which reflect the coordinate values for each end point of that edge segment) is stored for use in generating a hash signature.

As will be appreciated by those of ordinary skill in the art, the contour-related information described by the tuple #S(n, m, p, o) represents a finite-state machine that processes input data edge segment information of layout design data and produces output edge segment information. A useful mathematical property of the scan line technique described above is that the set o is independent of the input data ordering and vector shape.

With various examples of the disclosed technology, the values of the tuple will not be retained, but may instead simply be updated at each scan stop. The current tuple state will thus reflect the status of the data captured by the scan line up at that point. Alternately or additionally, various implementations of the disclosed technology may employ a compression scheme to reduce the size of the output data produced by the scan line process.

With various implementations of the disclosed technology, the signature computation unit 310 uses some or all of the contour-related information obtained for the layout data to generate a signature. For example, with some embodiments of the disclosed technology, end point coordinate values of edge segments making up the contours of geometric elements (and pluralities of abutting or overlapping geometric elements values) may fed into a hash function to produce a signature value. Thus, if the contour-related information is described by the tuple #S(n, m, p, o), then the values of the tuple o may be fed into a hash function to produce a signature value. With some implementations of the disclosed technology, the direction that the edge segment faces relative to the geometric element or plurality of abutting or overlapping geometric elements that it bounds also may be provided to the hash function with the end-point coordinate values.

Different implementations of the disclosed technology may employ any substantially canonical hash function. For example, some embodiments of the invention may employ the MD5 cryptographic hash function to generate signature values. As will be noted previously, the signatures produced by the hash function for interconnect segments on different physical layers and vias may be combined to generate a signature for the whole net of connected equipotential interconnects.

In operation 420, the parasitic element value determination unit 320 determines parasitic element values for the set of geometric elements based on comparing the signature with signatures for sets of computed geometric elements. The sets of computed geometric elements are sets of geometric elements having computed parasitic element values. These geometric elements may be associated with frequently-encountered and/or user-defined interconnect layout patterns. Their parasitic element values are computed before the start of the process 400 and stored in the database 305. Additionally or alternatively, the signatures and the computed parasitic element values may be associated with the sets of geometric elements that have just been processed by the parasitic extraction tool 300 and stored in the database 305. Using the stored computed parasitic element values, the parasitic extraction process can be expedited based on layout homotopy.

Mathematically, a set of electrically connected geometries (a "net of connected equipotential interconnects") can be represented as a parametrized curve, $f(t)=\{(x,y,l)\}$. Given the parameter t, the function f(t) traces out the curve (the geometry of the net) on (x,y) plane, and also changes the layer at the appropriate points. This converts an electrically connected collection of polygonal geometry into a parametric function. Each net consists of a finite number of nodes. The parametric representation is independent of the coordinate space, and scaling, and even rotation. Thus, to move the above net from (0,0) to (100,100) (a geometrical displacement known as translation), it is sufficient to think of a function g(t) which is (f(t)+[100,100]) (where the notation [100,100] denotes a vector). Similarly to scale the geometry by a factor of 0.98 (which is used in CMOS scaling and for geometrical shrinking), we can think of a function g'(t) which is f(t)*0.98, representing a scaled version of the layout. The parametric function f(t) thus represents an equivalence class of curves which are equivalent under parameterization. That is to say, two curves f(t) and g(t) are equivalent if g(t) can be obtained from g(t) using a function such as g(t)=f(h(t)).

Parasitic extraction computation essentially converts a set of geometric elements into an electrical representation, which is a collection of resistors, capacitors and inductors. This electrical representation is a parametric function, representing an equivalence class of geometric element sets. If signatures of two sets of geometric elements are equal, they will share the same parametric function. In another word, expensive computation based on resistance/capacitance field solvers may be performed just once for an equivalence class.

Figure 6:
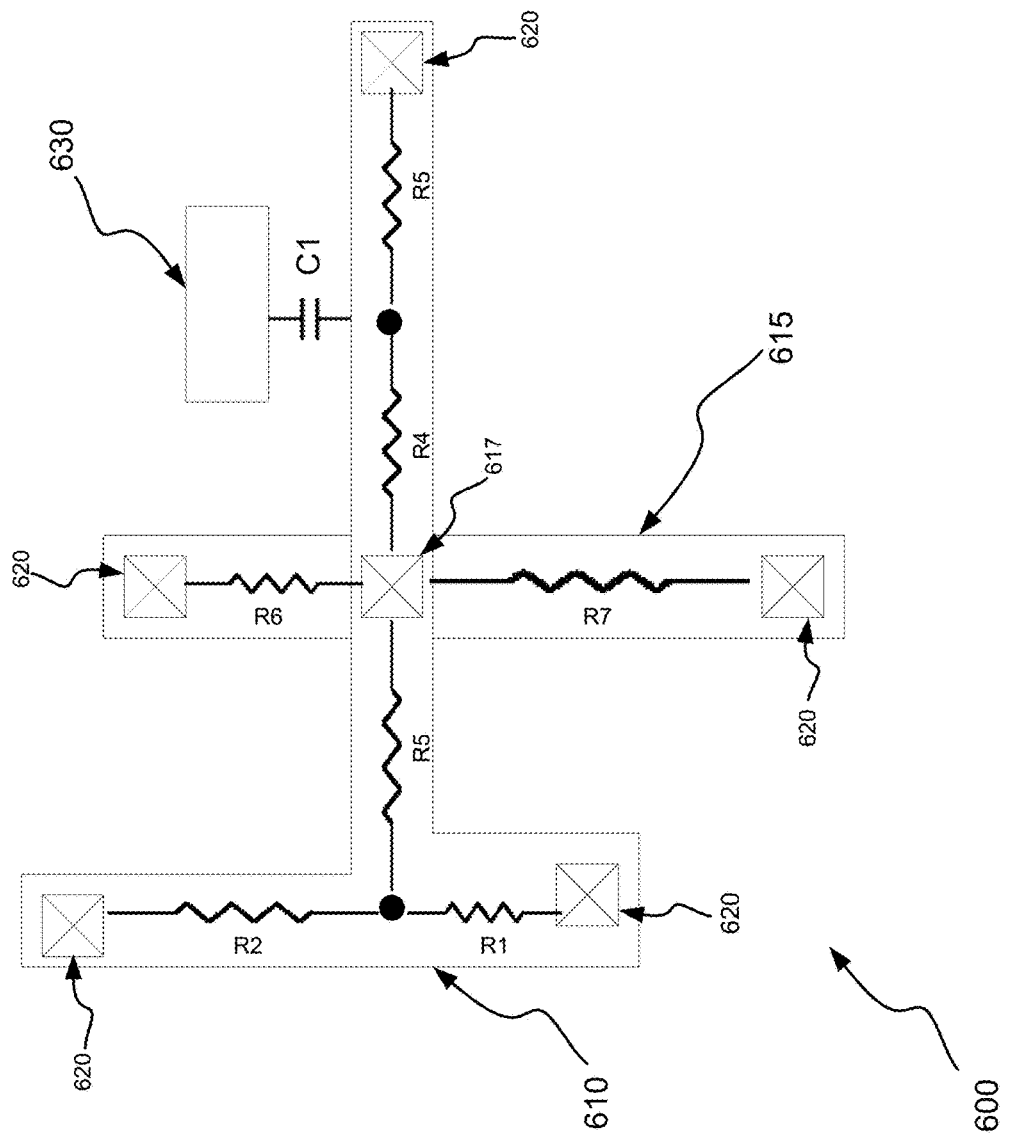
FIG. 6 illustrates an example of a set of geometric elements corresponding to a net of connected equipotential interconnects.

FIG. 6 illustrates an example of a set of geometric elements corresponding to a net of connected equipotential interconnects 600. In the figure, the net of connected equipotential interconnects 600 comprises an interconnect segment 610 on one layer and an interconnect segment 615 on another layer. These two interconnect segments are connected by a via 617. The rest vias 620 connect the net of connected equipotential interconnects to terminals of devices (e.g., transistors) and/or inputs/outputs. The net of connected equipotential interconnects is converted based on parasitic extraction computation into a parasitic resistance networks comprising resistors R1 through R7 based on parasitic resistance extraction. Simple analytical formulas or numerical solution of the appropriate form of Maxwell's equation may be employed to derive the resistance values. If the signature derived in the operation 410 matches the signature for the net of connected equipotential interconnects 600, the parasitic element value determination unit 320 may associate the corresponding computed parasitic element R1-R7 with the set of geometric elements.

An interconnect segment 630 shown in FIG. 6 is a segment of another net of connected equipotential interconnects. Parasitic capacitance may exist between the interconnect segment 630 and the interconnect segment 610, as illustrated by C1 in the figure. Similarly, capacitance C1 may be pre-computed and stored in the database 305 along with the signature associated with the interconnect segment 630 and the location information. If the signature derived in the operation 410 matches the signature for the net of connected equipotential interconnects 600, a signature for a second net of connected equipotential interconnects matches one of the signatures, and location information of the net of connected equipotential interconnects relative to the second net of connected equipotential interconnects matches one for corresponding two sets of computed geometric elements, the parasitic element value determination unit 320 may associate the corresponding computed parasitic element values R1-R7 and C1 with the set of geometric elements.

If the signature derived in the operation 410 matches none of the signatures stored in the database 305, the parasitic element value determination unit 320 may compute parasitic element values for the net of connected equipotential interconnects and adding the signature to the signatures.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions for causing one or more processors to perform a method, the method comprising:
   receiving layout design data of an integrated circuit comprising a plurality of nets, each net being a connected group of equipotential interconnects and comprising a set of geometrical elements;
   computing a first signature of a first net of the nets based on contour-related information;
   obtaining a second signature of a second net of the nets;
   determining that the following conditions are true:
      the first signature matches a first precomputed signature of a first precomputed net;
      the second signature matches a second precomputed signature of a second precomputed net; and
      relative location information of the first and second nets matches relative location information of the first and second precomputed nets;
   responsive to the determining, assigning a precomputed parasitic capacitance value to the first net; and
   forwarding the layout design data, with the precomputed parasitic capacitance value assigned to the first net, to an electronic design automation tool for physical verification.

2. The one or more non-transitory computer-readable media recited in claim 1, wherein the first signature is computed based on third signatures for geometric elements on individual physical layers and on fourth signatures for interconnects between the physical layers.

3. The one or more non-transitory computer-readable media recited in claim 2, wherein the third signatures for geometric elements on individual physical layers are derived using a mathematical function.

4. The one or more non-transitory computer-readable media recited in claim 1, wherein the contour-related information is generated based on a rasterizing scanline analysis of the geometrical elements on individual physical layers.

5. The one or more non-transitory computer-readable media of claim 1, wherein the method further comprises:
   computing a third signature of a third net of the nets;
   determining that the third signature does not match any previously computed signature of the nets; and
   responsive to the determining for the third signature, computing parasitic element values for the third net.

6. The one or more non-transitory computer-readable media of claim 1, wherein the method further comprises:
   computing a third signature of a third net of the nets;
   determining that the third signature matches a third precomputed signature of a third precomputed net, and relative location information of the second and third nets does not match relative location information of the second and third precomputed nets; and
   responsive to the not matching determination, computing a parasitic capacitance value for the third net.

7. A method, executed by at least one processor of a computer, comprising:
   by the at least one processor of the computer:
      receiving layout design data of an integrated circuit comprising a plurality of nets, each net being a set of equipotential interconnects corresponding to a set of geometrical elements;
      computing a first signature for a first one of the nets based on contour-related information; and
      obtaining a second signature of a second one of the nets matching a first precomputed signature of a first precomputed net;
      determining that:
         the first signature matches a second precomputed signature of a second precomputed net; and
         relative location information of the first and second nets matches relative location information of the second and first precomputed nets;
      subsequent to the determining, associating a precomputed parasitic capacitance value with the first net; and
      forwarding the layout design data, with the associated precomputed parasitic capacitance value of the first net, to an electronic design automation tool for physical verification.

8. The method recited in claim 7, wherein the first signature is computed based on third signatures for geometric elements on individual physical layers and on fourth signatures for interconnects between the physical layers.

9. The method recited in claim 8, wherein the third signatures for geometric elements on individual physical layers are derived using a mathematical function.

10. The method recited in claim 7, wherein the contour-related information is generated based on a rasterizing scanline analysis of the geometrical elements on individual physical layers.

11. The method of claim 7, further comprising:
   computing a third signature of a third net of the nets;
   determining that the third signature does not match any previously computed signature of the nets; and
   responsive to the determining for the third signature, computing parasitic element values for the third net.

12. The method of claim 11, wherein the parasitic element values for the third net comprise a parasitic resistance value, a parasitic capacitance value, or both.

13. The method of claim 7, further comprising:
   computing a third signature of a third net of the nets;
   determining that the third signature matches a third precomputed signature of a third precomputed net, and relative location information of the second and third nets does not match relative location information of the first and third precomputed nets; and
   responsive to the not matching determination, computing a parasitic capacitance value for the third net.

14. A system comprising:
   one or more processors with memory coupled thereto, the one or more processors programmed to perform a method, the method comprising:

receiving layout design data of an integrated circuit comprising a plurality of nets, each net being a connected group of equipotential interconnects and comprising a set of geometrical elements;

computing a first signature of a first net of the nets based on second signatures of respective geometric elements on single physical layers and on third signatures of interconnects between the single physical layers, the second signatures being based on contour-related information; and determining parasitic element values for the first net based on comparing the first signature with fourth signatures of previously computed second nets, the second nets having previously computed parasitic element values; and forwarding the layout design data, with the determined parasitic element values for the first net, to an electronic design automation tool for physical verification.

15. The system recited in claim 14, wherein the determining comprises:

associating some of the previously computed parasitic element values with the first net if the first signature matches one of the fourth signatures; and computing new parasitic element values for the first net and adding the first signature to the fourth signatures if the first signature matches none of the fourth signatures.

16. The system recited in claim 14, wherein the determining comprises:

associating some of the computed parasitic element values with the first net if the first signature matches one of the fourth signatures, a fifth signature for a second net matches another one of the fourth signatures, and relative location information of the first net and the second net matches one for corresponding two sets of computed geometric elements relative location information of the two previously computed second nets corresponding to the matched fourth signatures.

17. The system recited in claim 14, wherein the second signatures for geometric elements on single physical layers are derived using a mathematical function.

18. The system recited in claim 14, wherein the contour-related information is generated based on a rasterizing scanline analysis of the respective geometrical elements on single physical layers.

19. The system of claim 14, wherein the parasitic element values comprise parasitic resistance values, parasitic capacitance values, or both.

20. The one or more non-transitory computer-readable media of claim 5, wherein the parasitic element values for the third net comprise parasitic resistance values, parasitic capacitance values, or both.

* * * * *